United States Patent
Baggenstoss

(10) Patent No.: US 8,101,454 B2
(45) Date of Patent: Jan. 24, 2012

(54) METHOD OF FORMING PIXEL CELL HAVING A GRATED INTERFACE

(75) Inventor: William J. Baggenstoss, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 670 days.

(21) Appl. No.: 11/293,245

(22) Filed: Dec. 5, 2005

(65) Prior Publication Data

US 2006/0081900 A1    Apr. 20, 2006

Related U.S. Application Data

(62) Division of application No. 10/893,276, filed on Jul. 19, 2004, now Pat. No. 7,880,255.

(51) Int. Cl.
- H01L 21/302 (2006.01)
- H01L 21/31 (2006.01)
- H01L 31/0232 (2006.01)
- H01L 31/0236 (2006.01)

(52) U.S. Cl. ..... 438/71; 438/72; 257/437; 257/E21.214; 257/E21.24; 257/E31.12; 257/E31.13

(58) Field of Classification Search .......... 257/291, 257/292, 293, 294, 436, 461, 466, E31.031, 257/E31.038, E21.214, E21.24, E21.536, 257/E21.598, E31.032, E31.03, E31.039, 257/E31.11, E31.119, E31.12, E31.121, E31.122, 257/E31.123; 438/57, 69, 71, 72, 73
See application file for complete search history.

(56) References Cited

U.S. PATENT DOCUMENTS

| | | | | |
|---|---|---|---|---|
| 3,934,060 A * | 1/1976 | Burt et al. | | 438/790 |
| 4,758,531 A * | 7/1988 | Beyer et al. | | 438/429 |
| 4,820,654 A * | 4/1989 | Lee | | 438/429 |
| 4,886,763 A * | 12/1989 | Suzuki | | 438/429 |
| 6,140,630 A | 10/2000 | Rhodes | | |
| 6,204,524 B1 | 3/2001 | Rhodes | | |
| 6,310,366 B1 | 10/2001 | Rhodes et al. | | |
| 6,326,652 B1 | 12/2001 | Rhodes | | |
| 6,333,205 B1 | 12/2001 | Rhodes | | |
| 6,376,868 B1 | 4/2002 | Rhodes | | |
| 6,461,003 B1 * | 10/2002 | Neudeck | | 359/529 |
| 6,611,037 B1 * | 8/2003 | Rhodes | | 257/466 |

(Continued)

FOREIGN PATENT DOCUMENTS

EP    1 096 274 A2    5/2001

(Continued)

OTHER PUBLICATIONS

Turchetta et al., "Introduction to CMOS Image Sensors", 1998, especially pp. 7-8 of 13. Retreived on May 13, 2008 from http://www.molecularexpressions.com/primer/digitalimaging/cmosimagesensors.html.*

(Continued)

*Primary Examiner* — Samuel Gebremariam
*Assistant Examiner* — Andrew O. Arena
(74) *Attorney, Agent, or Firm* — Dickstein Shapiro LLP

(57) ABSTRACT

A pixel cell having a photosensor within a silicon substrate; and an oxide layer provided over the photosensor, the oxide layer having a grated interface with said silicon substrate, and a method of fabricating the pixel cell having a grated interface.

34 Claims, 13 Drawing Sheets

U.S. PATENT DOCUMENTS

| | | | |
|---|---|---|---|
| 6,730,980 B2 * | 5/2004 | Rhodes | 257/466 |
| 6,767,759 B2 * | 7/2004 | Rhodes | 438/60 |
| 6,838,742 B2 * | 1/2005 | Rhodes | 257/448 |
| 7,091,059 B2 * | 8/2006 | Rhodes | 438/60 |
| 7,279,766 B2 * | 10/2007 | Rhodes | 257/461 |
| 2002/0000244 A1 * | 1/2002 | Zaidi | 136/259 |
| 2002/0089004 A1 * | 7/2002 | Rhodes | 257/290 |
| 2003/0205741 A1 * | 11/2003 | Rhodes | 257/290 |
| 2004/0178323 A1 * | 9/2004 | Rhodes | 250/214.1 |
| 2004/0235216 A1 * | 11/2004 | Rhodes | 438/60 |
| 2005/0093038 A1 * | 5/2005 | Rhodes | 257/292 |

FOREIGN PATENT DOCUMENTS

| | | |
|---|---|---|
| EP | 1 096 274 A3 | 4/2002 |
| JP | 20000 12822 | 1/2000 |

OTHER PUBLICATIONS

Neudeck et al., "Precision Crystal Corner Cube Arrays for Optical Gratings Formed by (100) Silicon Planes with Selective Epitaxial Growth", Applied Optics, vol. 35, No. 19, Jul. 1996, pp. 3466-3470.*

Albreksten et al., "Gratings for Distributed Feedback Lasers Formed by Selective Epitaxial Growth", Indium Phosphide and related materials, Proceedings from IEEE Sixth International Conference on Mar. 27-31, 1994.*

Written Opinion of the Australian Patent Office, Nov. 26, 2007.

P. Arguel, et al., "A Monolithic Phase Measurement Photodetector," 2003, IEEE.

PCT Notification of Transmittal of the International Search Report and the Written Opinion of the International Searching Authority.

* cited by examiner

METHOD OF FORMING PIXEL CELL HAVING A GRATED INTERFACE

This application is a divisional of application Ser. No. 10/893,276, filed on Jul. 19, 2004, now U.S. Pat. No. 7,880,255 which is incorporated herein by reference in its entirety.

FIELD OF THE INVENTION

The present invention relates generally to imaging devices, and particularly to a pixel cell having a grated interface, and a method of forming the pixel cell having a grated interface.

BACKGROUND OF THE INVENTION

Integrated circuits, including dies, for example, imager dies such as charge-coupled-devices (CCD) and complementary metal oxide semiconductor (CMOS) dies, have commonly been used in photo-imaging applications.

Imager dies, such as the CMOS imager die, typically contain thousands of pixels in a pixel array on a single chip. Pixels convert light into an electrical signal that can then be stored and recalled by an electrical device such as, for example, a processor. The electrical signals that are stored may be recalled to produce an image on, for example, a computer screen or a printable media.

Exemplary CMOS imaging circuits, processing steps thereof, and detailed descriptions of the functions of various CMOS elements of an imaging circuit are described, for example, in U.S. Pat. No. 6,140,630, U.S. Pat. No. 6,376,868, U.S. Pat. No. 6,310,366, U.S. Pat. No. 6,326,652, U.S. Pat. No. 6,204,524, and U.S. Pat. No. 6,333,205, each of which being assigned to Micron Technology, Inc. The disclosures of each of the forgoing patents are hereby incorporated by reference in their entirety.

FIG. 1 illustrates a block diagram of an imager die 10, having a CMOS imager device 8 formed therein. The CMOS imager device 8 has a pixel array 15 that comprises a plurality of pixels arranged in a predetermined number of columns and rows. The pixel cells of each row in the pixel array 15 are all turned on at the same time by a row select line, and the pixel cells of each column are selectively output by respective column select lines. A plurality of row and column lines is provided for the entire pixel array 15. The row lines are selectively activated in sequence by a row driver 1 in response to a row address decoder 2 and the column select lines are selectively activated in sequence for each row activation by a column driver 3 in response to a column address decoder 4. The CMOS imager device 8 is operated by the control circuit 5, which controls the address decoders 2, 4 for selecting the appropriate row and column lines for pixel readout, and row and column driver circuitry 1, 3 for applying driving voltages to the drive transistors of the selected row and column lines.

The pixel output signals typically include a pixel reset signal $V_{rst}$ taken from a charge storage node when it is reset and a pixel image signal $V_{sig}$ which is taken from the storage node after charges generated by an image are transferred to the node. The $V_{rst}$ and $V_{sig}$ signals are read by a sample and hold circuit 6 and are subtracted by a differential amplifier 7 that produces a difference signal ($V_{rst}-V_{sig}$) for each pixel cell, which represents the amount of light impinging on the pixels. This difference signal is digitized by an analog-to-digital converter (ADC) 9. The digitized pixel difference signals are then fed to an image processor 11 to form and output a digital image. In addition, as depicted in FIG. 1, the CMOS imager device 8 may be included on a single semiconductor chip to form the imager die 10.

A partial cross-sectional view of a conventional pixel cell 13 that could be incorporated into the pixel array 15 of FIG. 1 is illustrated in FIG. 2. The illustrated pixel cell 13 typically includes a photosensor 12 having a p-region 12a and n-region 12b in a p-type substrate 14. The substrate 14 is typically a p-type silicon substrate. The p-region 12a of the photosensor 12 is typically coupled to the potential of the p-substrate 14 for efficient operation of the photosensor 12. The pixel cell 13 also includes a transfer transistor with associated gate 16, a floating diffusion region 18 formed in a more heavily doped p-type well 20, and a reset transistor with associated gate 22. The reset transistor 22 has an associated source/drain region 30 connected to a supply voltage Vaa-pix that is used to reset the floating diffusion region 18 to a predetermined charge level (i.e., supply voltage Vaa-pix level) prior to charge transference.

In operation, incident light 36 from a light source 38 striking the surface of the p-region 12a of the photosensor 12 generates electrons that are collected in the n-region 12b. When the transfer gate 16 is on, the generated electrons in the n-region 12b are transferred to the floating diffusion region 18 as a result of the potential difference existing between the photosensor 12 and the floating diffusion region 18. The floating diffusion region 18 is coupled to the gate of a source follower transistor 24, which receives the charge stored by the floating diffusion region 18 and transfers a voltage corresponding to the charge to a first source/drain terminal of a row select transistor 26. When a row select control signal RS goes high, the voltage corresponding to the generated charge is transferred to the column line 28 where it is further processed by sample/hold and processing circuits such as the sample and hold circuit 6 (FIG. 1).

The illustrated pixel cell 13 is formed between two isolation regions, or shallow trench isolation (STI) regions 32. The STI regions 32 prevent crosstalk between adjacent pixels, as pixel cell 13 is only one of hundreds or thousands of pixels that can be incorporate into the pixel array of an imager die (e.g., pixel array 15 of imager die 10 (FIG. 1)).

The pixel cell 13 is typically formed with an oxide layer 34 over the surface of the substrate 14. Various other layers (not shown) are typically deposited over the pixel cell 13. For example, a tetraethyl orthosilicate ($Si(OC_2H_5)_4$) (TEOS) layer may be deposited over the oxide layer 34. Similarly, a boro-phospho-silicate glass (BPSG) layer could be deposited over the TEOS layer. A metallization layer and insulating layer can also be deposited over the pixel cell 13.

One adverse effect of depositing the oxide layer 34 over the substrate 14 is the reflection of incident light 36. In operation, incident light 36 from the light source 38 encounters the oxide layer 34 before striking the p-region 12a of the photosensor 12. The index of refraction for the oxide layer can be as low as 1.6; whereas the index of refraction of the substrate 14 (formed of silicon) can be as high as 4.0. The abrupt transition from an index of refraction of 1.6 to 4.0 results in a high percentage of incident light reflection 40. The percentage of incident light 36 that is reflected can be determined using the following formula:

$$\text{Reflection}=|X-Y|^2/(X+Y)^2; \qquad (1)$$

wherein X represents the index of refraction of the oxide layer 34, and Y represents the index of refraction of the substrate 14. In the above-described example, the reflection percentage is $|4.0-1.61|^2/(4.0+1.6)^2 \sim 18\%$. Therefore, the photosensor 12 fails to capture approximately 18% of the incident light 36 to which it is exposed. This is undesirable.

Accordingly, there is a desire and need for a pixel cell that can capture a greater percentage of incident light by reducing the percentage of incident light that is reflected.

BRIEF SUMMARY OF THE INVENTION

The present invention provides a pixel cell that can capture a greater percentage of incident light, as compared to conventional pixels.

The present invention relates to a pixel cell having a photosensor within a silicon substrate and an oxide layer provided over the photosensor, wherein the oxide layer has a grated interface with the silicon substrate. The grated interface allows a greater percentage of incident light to be captured, which is a vast improvement over the art.

BRIEF DESCRIPTION OF THE DRAWINGS

The above-described features and advantages of the invention will be more clearly understood from the following detailed description, which is provided with reference to the accompanying drawings in which.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The terms "semiconductor substrate," "silicon substrate," and "substrate" are to be understood to include any semiconductor-based structure. The semiconductor structure should be understood to include silicon, silicon-on-insulator (SOI), silicon-on-sapphire (SOS), silicon-germanium, doped and undoped semiconductors, epitaxial layers of silicon supported by a base semiconductor foundation, and other semiconductor structures. When reference is made to the substrate in the following description, previous process steps may have been utilized to form regions or junctions in or over the base semiconductor or foundation.

The term "pixel," as used herein, refers to a photo-element unit cell containing a photosensor for converting photons to an electrical signal. For purposes of illustration, a single representative pixel and its manner of formation are illustrated in the figures and description herein; however, typically fabrication of a plurality of like pixels proceeds simultaneously. Accordingly, the following detailed description is not to be taken in a limiting sense, and the scope of the present invention is defined only by the appended claims.

The terms "grated interface" or "grating," as used herein, refer to an interface between two material layers, wherein one of the two material layers has at least one trench, and the other of the two material layers is provided within and over the at least one trench.

Figure 2:
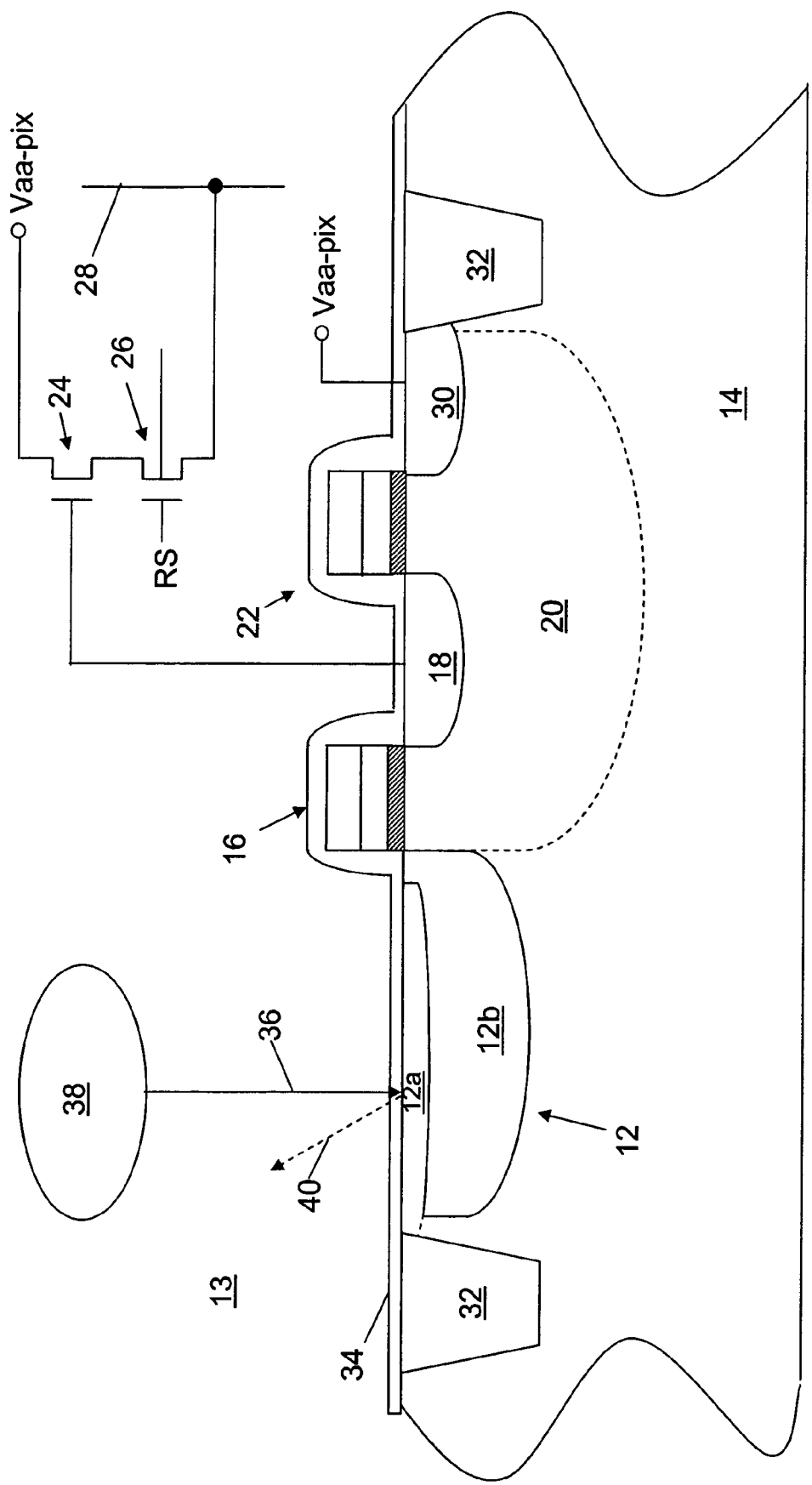
FIG. 2 illustrates a partial cross-sectional view of a conventional pixel cell.
Figure 3:
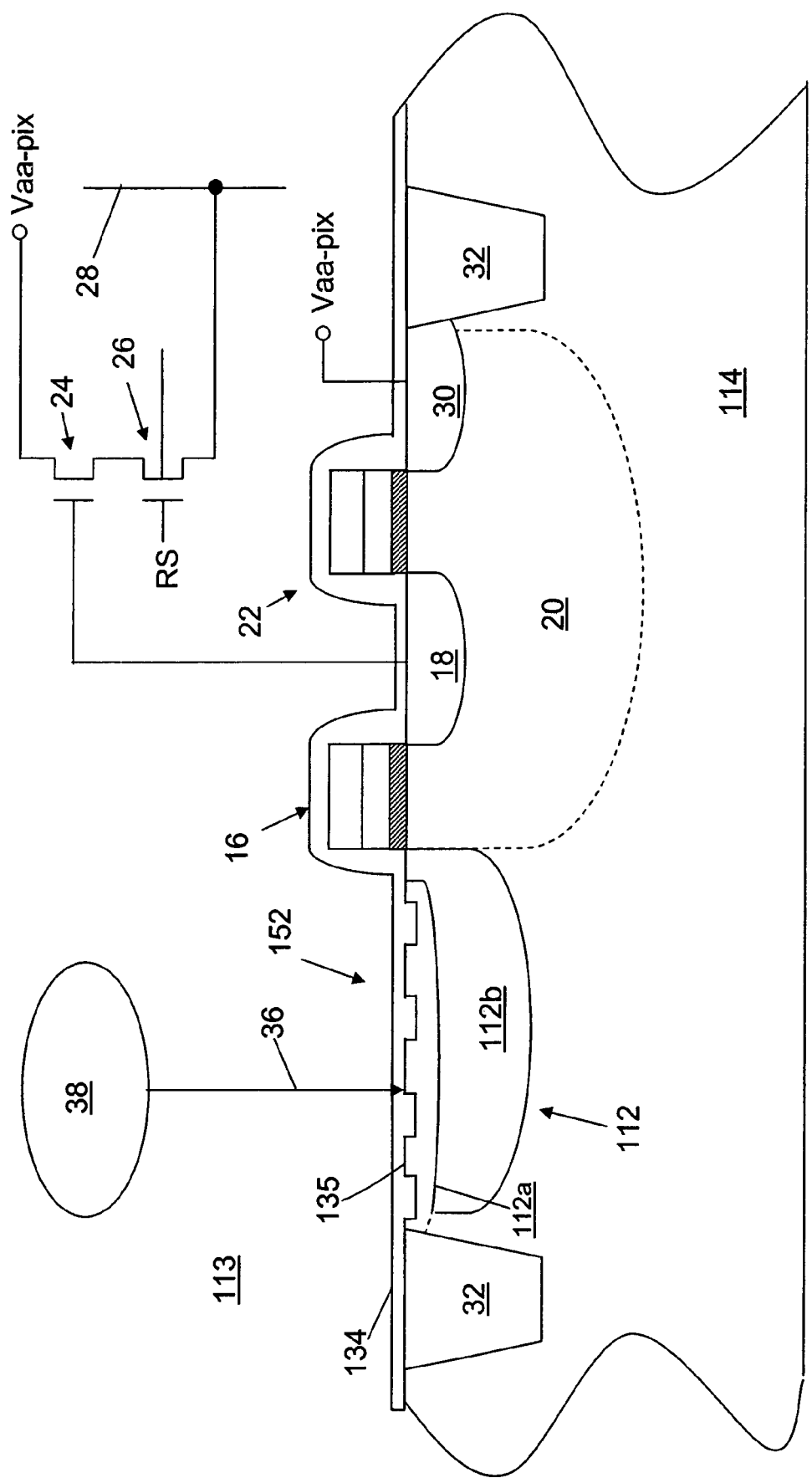
FIG. 3 illustrates a partial cross-sectional view of a pixel cell constructed in accordance with an exemplary embodiment of the invention.

Referring now to the figures, where like reference numbers designate like elements, FIG. 3 illustrates an exemplary pixel cell 113 constructed in accordance with an embodiment of the invention. Pixel cell 113 is similar to the FIG. 2 pixel cell 13 with the significant improvement of having a grated interface 135 between an oxide layer 134 and a photosensitive region 152 of the substrate 114 containing a photosensor 112.

The grated interface 135 of the pixel cell 113 serves to create a hybrid index of refraction between the oxide layer 134 and the substrate 114. In contrast to the FIG. 2 pixel cell 13, when incident light 36 strikes the pixel cell 113, the light does not meet an abrupt transition in the indexes of refraction between the oxide layer 34 (FIG. 2) and the substrate 14 (FIG. 2). Rather, the hybrid index of refraction is higher than that of the oxide layer 134, but lower than that of the silicon substrate 114, thereby decreasing the percentage of incident light reflection 40 (FIG. 2) found in the conventional pixel cell 13 (FIG. 2).

Figure 4:
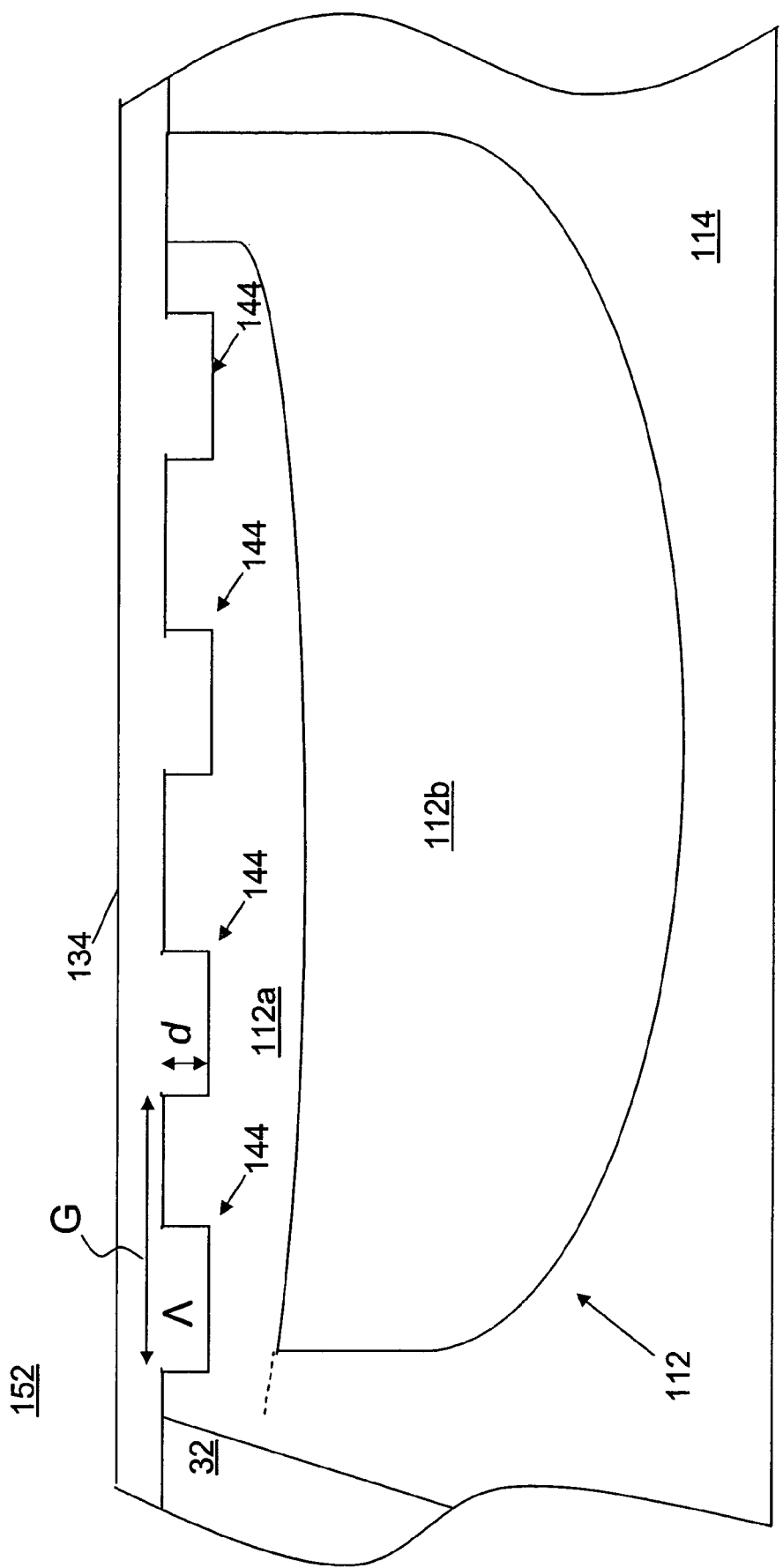
FIG. 4 illustrates a magnified portion of the photosensitive region of the FIG. 3 pixel cell.

FIG. 4 illustrates a magnified portion of the photosensitive region 152 (including photosensor 112) of the FIG. 3 pixel cell 113. FIG. 4 illustrates that the oxide layer 134 is provided within and over trenches 144 formed within the substrate 114, thereby forming the grated interface 135. Each grating (measured as the distance from the beginning of one trench 144 to the beginning of the next trench 144 (shown by arrow G)) has a predetermined period that is represented by Λ. The predetermined period Λ of the grating G may be in the range from about 100 nm to about 1000 nm. The trenches 144 also have a predetermined depth, represented by d. The depth d of the trench 144 should be in the range from about 10 nm to about 250 nm.

It should be noted that the foregoing ranges are only exemplary embodiments of the present invention, and are not limiting in any way. For example, the gratings could have periods Λ longer than 1000 nm or shorter than 100 nm. Similarly, the depth d of the trenches 144 could be deeper than 250 nm or shallower than 10 nm. The actual periods Λ and depths d can be optimized for the particular wavelength of the incident light that is intended to be captured by the photosensor 112. Although illustrated as semi-rectangular, the trenches 144 of FIG. 4 are not so limited. Rather, the actual dimensions of the trenches 144 are dependent upon the intended application.

Figure 5A:
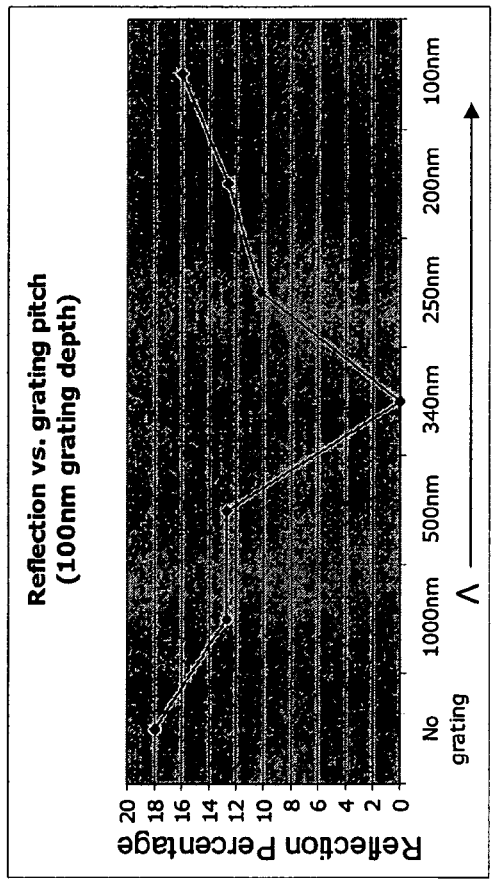
FIGS. 5A and 5B are graphs illustrating the percentage of reflection as a function of varying the depths of the trenches forming the basis of a grated interface and the periods of the grated interface.
Figure 5B:
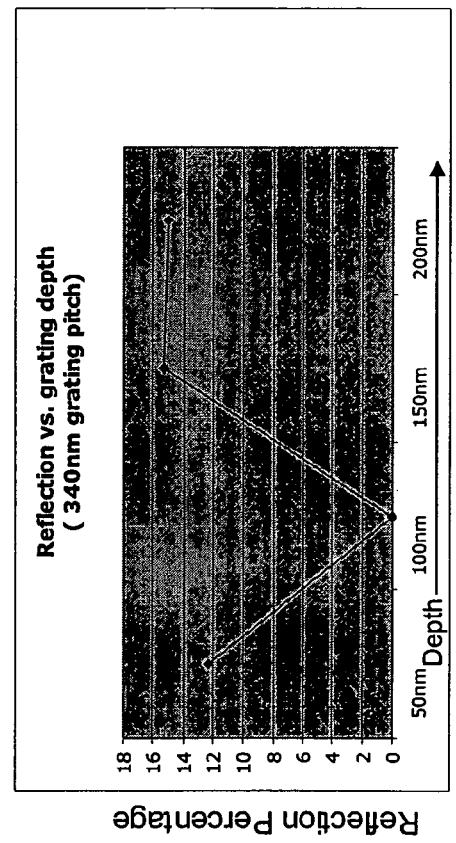

FIGS. 5A and 5B are graphs that represent the percentage of reflection of incident light 36 (FIG. 3) as a function of varying the period Λ of the gratings and depth d of the trenches of the exemplary embodiments of the invention. FIG. 5A illustrates the percentage of incident light reflection as a function of varying the period Λ of the grating in the pixel cell 113 of the invention. As illustrated in FIG. 5A, the grating has a constant depth d equal to 100 nm. The percentage of incident light reflection is approximately 18% with no grating, as discussed above with respect to FIG. 2. The percentage of incident light reflection continues to be high where the period Λ is 1000 nm. As the period Λ of the grating is decreased, however, the percentage of incident light reflection is nearly eliminated at a period Λ of 340 nm. As the grating is further decreased, the percentage of incident light reflection increases.

FIG. 5B illustrates the percentage of incident light reflection as a function of the depth d of the trenches 144 (FIG. 4). As illustrated, the grating has a constant period Λ equal to 340 nm. The incident light reflection decreases as the depth of the trenches 144 (FIG. 4) increases, and is nearly eliminated when the trenches have a depth d of 100 nm. As the depth of the trenches increases after 100 nm, however, the percentage of incident light reflection increases as well. Therefore, the actual periods Λ and depths d could be varied depending upon the desired amount of reflection.

Figure 6:
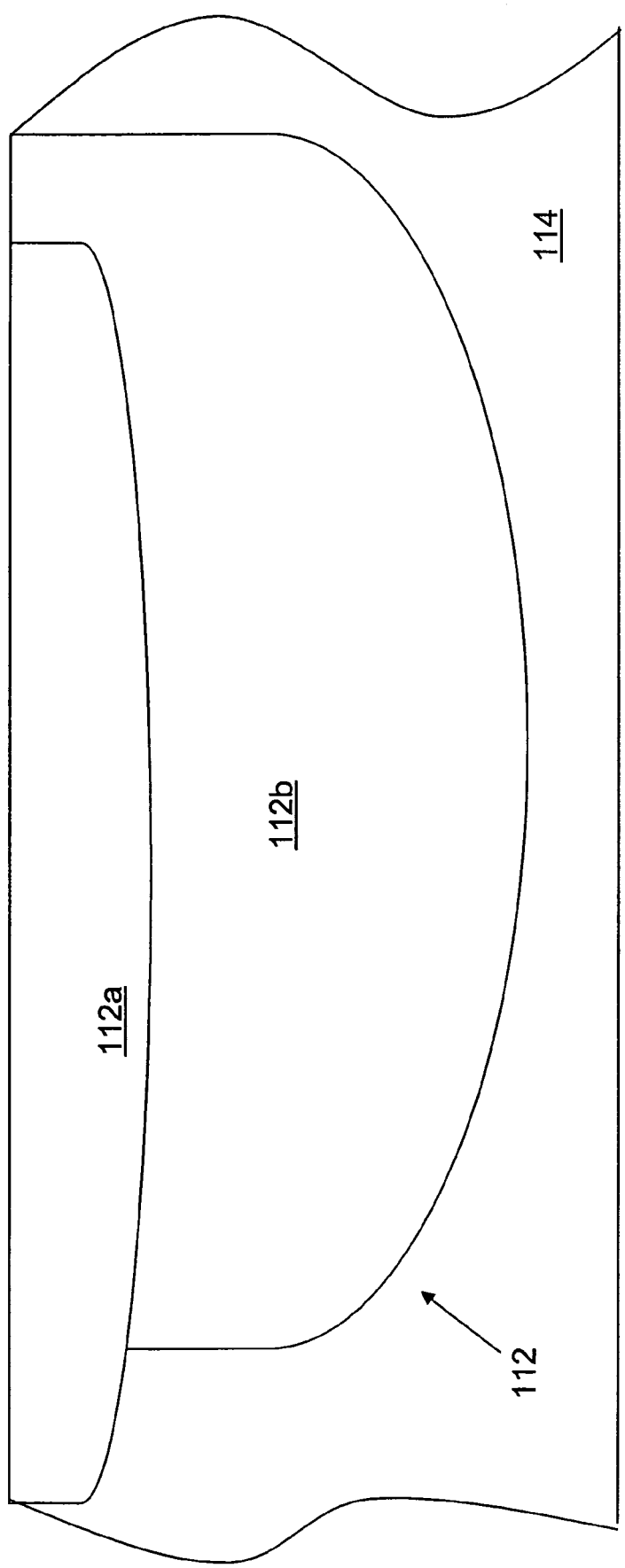
FIGS. 6-8 illustrate stages in fabrication of the FIG. 4 photosensitive region.
Figure 7:
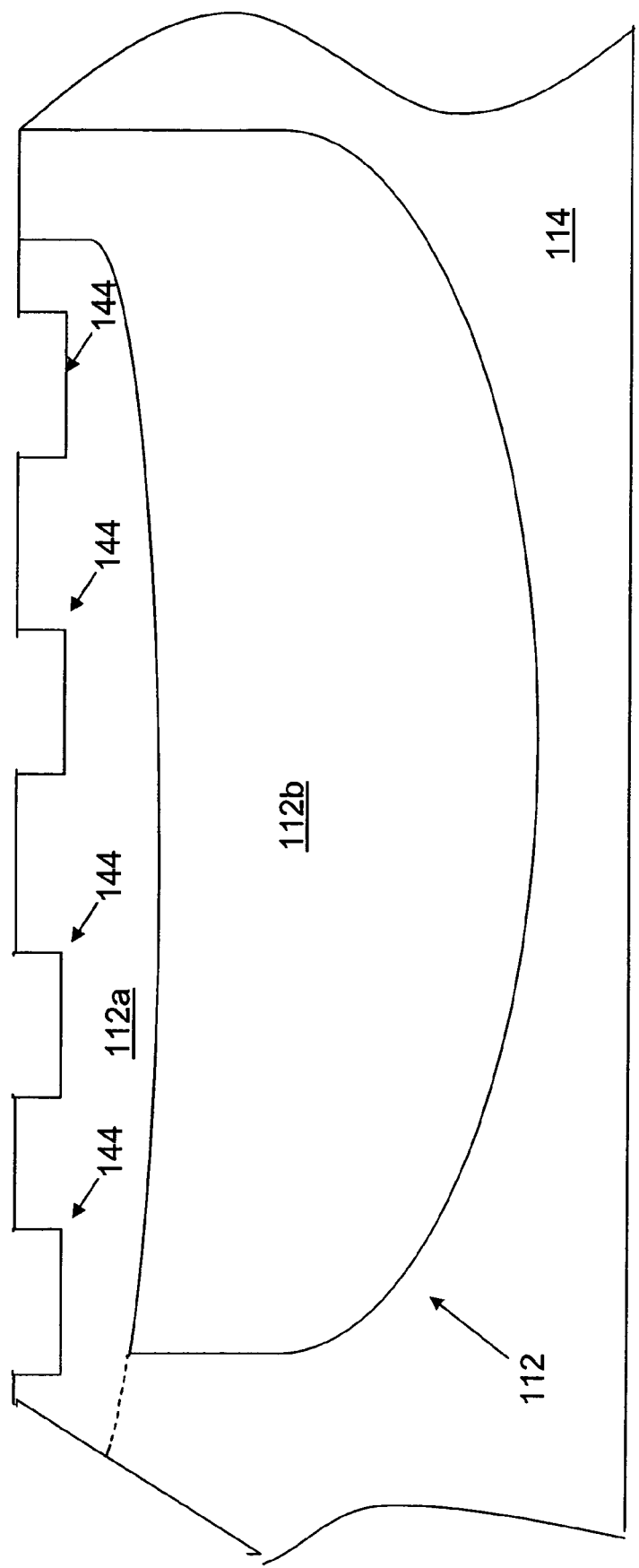
Figure 8:
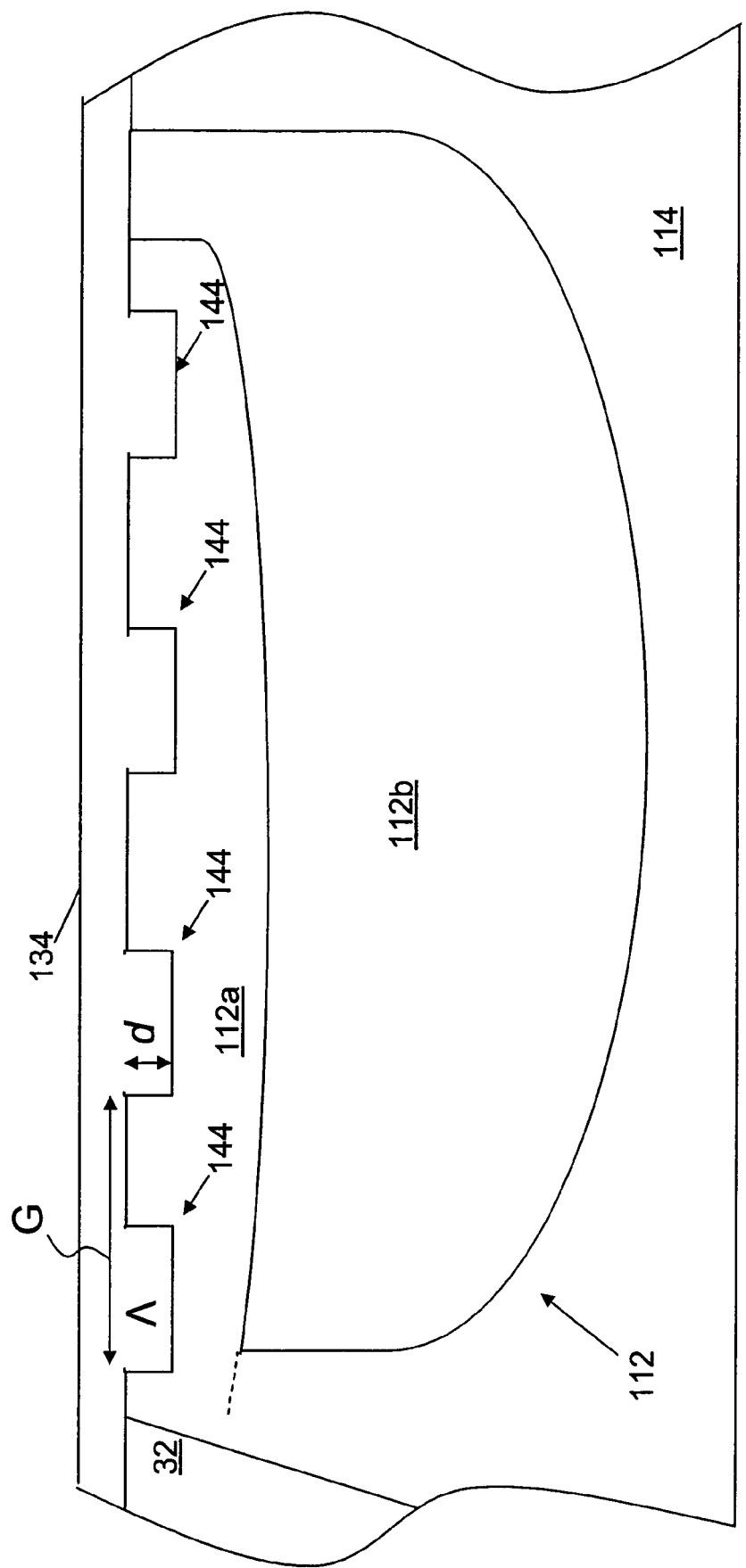

FIGS. 6-8 illustrate stages of an exemplary method of forming the FIG. 4 photosensitive region 152. FIG. 6 illustrates a photosensor 112 formed within a silicon substrate 114. The photosensor 112 has a first doped region 112a and second doped region 12b formed in the substrate 114. The first doped region 112a of the photosensor 112 is typically coupled to the potential of the substrate 114 for efficient operation. For example, if the substrate 114 is a p-type substrate, the first doped region 112a is typically a p-region. Conversely, the second doped region 112b is typically the other of a p-type or n-type region. For example, if the substrate 114 is a p-type substrate, then the second doped region 112b is typically an n-type region. It should be noted that the foregoing example is not limiting in any way. For example, the first doped region 112a and the substrate 114 could be doped with n-type dopants, and the second doped region 112b could be doped with a p-type dopant.

Although illustrated as a photodiode, the photosensor 112 is not intended to be limited in any way. For example, the photosensor 112 could be any photosensitive region capable of converting photons from incident light into electrical charges that can be stored and recalled.

FIG. 7 illustrates a plurality of trenches 144 formed within the silicon substrate over the photosensor 112. The trenches 144 could be formed by chemical etching, reactive ion etching (RIE), or other techniques for creating a recess in the silicon substrate 114. It should be noted that the foregoing methods of creating the trenches 144 that form the basis for the grated interface are not limiting in any way. For example, the trenches 144 could also be formed by laying a photoresist pattern on the silicon substrate, and creating columns of silicon substrate material by epitaxial growth, where a trench 144 is formed between each of the silicon substrate material columns.

FIG. 8 illustrates the oxide layer 134 provided over and within the trenches 144, thereby creating the grated interface G having a predetermined period Λ and having a predetermined depth d.

It should be noted that FIGS. 6-8 illustrate only one exemplary method of forming the pixel cell 113, and that the method is not intended to be limiting. For example, the plurality of trenches 144 could be formed prior to forming the photosensor 112 (i.e., before the doping steps described above). It should also be noted that various material layers (not shown) may be deposited over the oxide layer 134. For example, a tetraethyl orthosilicate $(Si(OC_2H_5)_4)$ (TEOS) layer may be deposited over the oxide layer 134. Similarly, a boro-phospho-silicate glass (BPSG) layer could be deposited over the TEOS layer. A metallization layer and insulating layer can also be deposited over the oxide layer 134.

Figure 9:
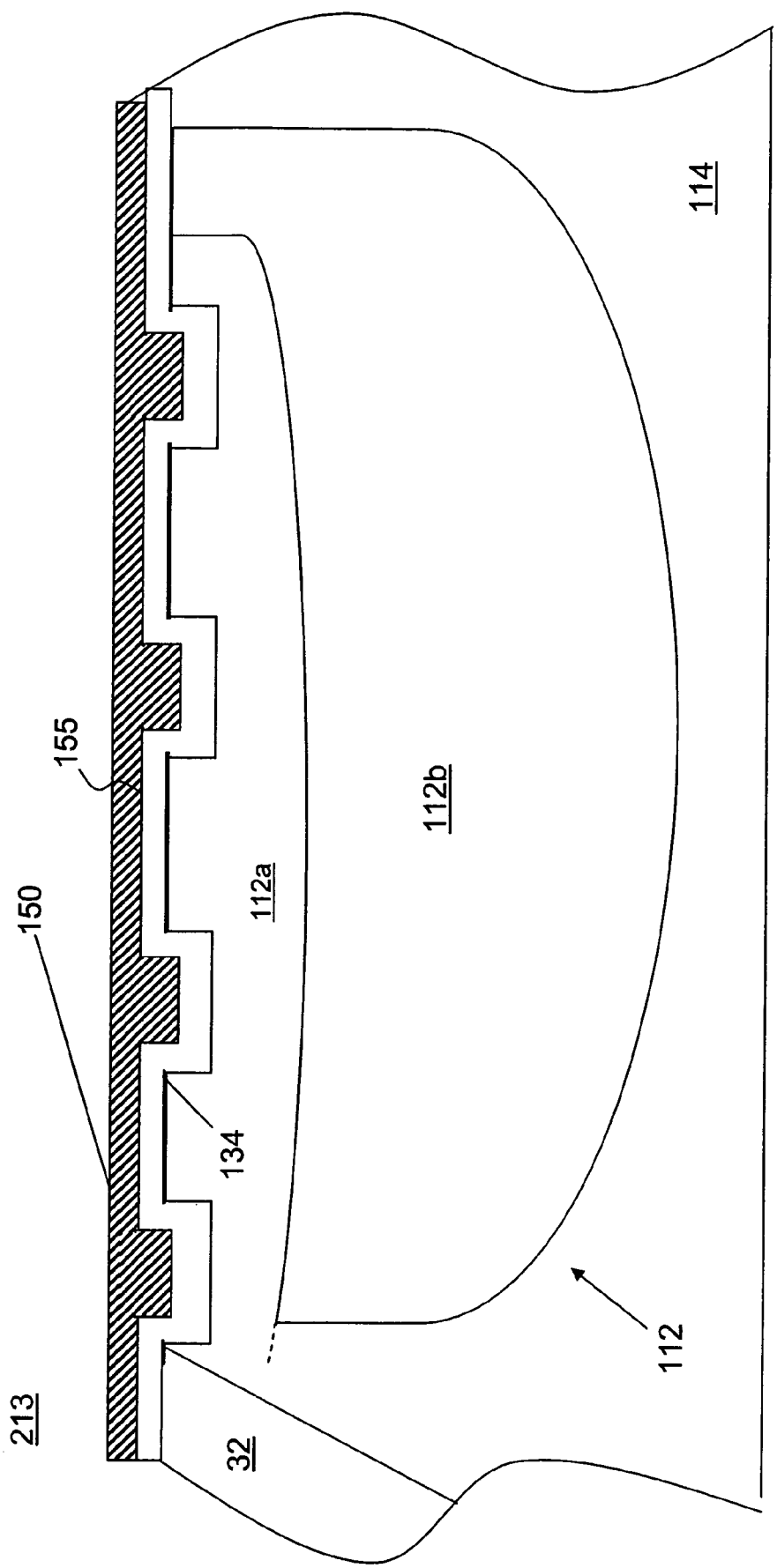
FIG. 9 illustrates a partial cross-sectional view of a pixel cell constructed in accordance with a second exemplary embodiment of the invention.

FIG. 9 illustrates a second exemplary embodiment of the present invention. Pixel cell 213 is similar to the FIG. 3 pixel cell 113, with the exception that a material layer 150 has a grated interface 155 with the oxide layer 134. The grated interface 155 may further decrease the abrupt transition that the incident light 136 (FIG. 3) may encounter as it moves through the material layer 150 to the oxide layer 134. The material layer 150 may have a disparately high or low index of refraction relative to the oxide layer 134, which may result in a high percentage of incident light reflection 40 (FIG. 2). The grated interface may increase the amount of incident light 36 (FIG. 3) that is captured by the photosensor 112.

Figure 10:
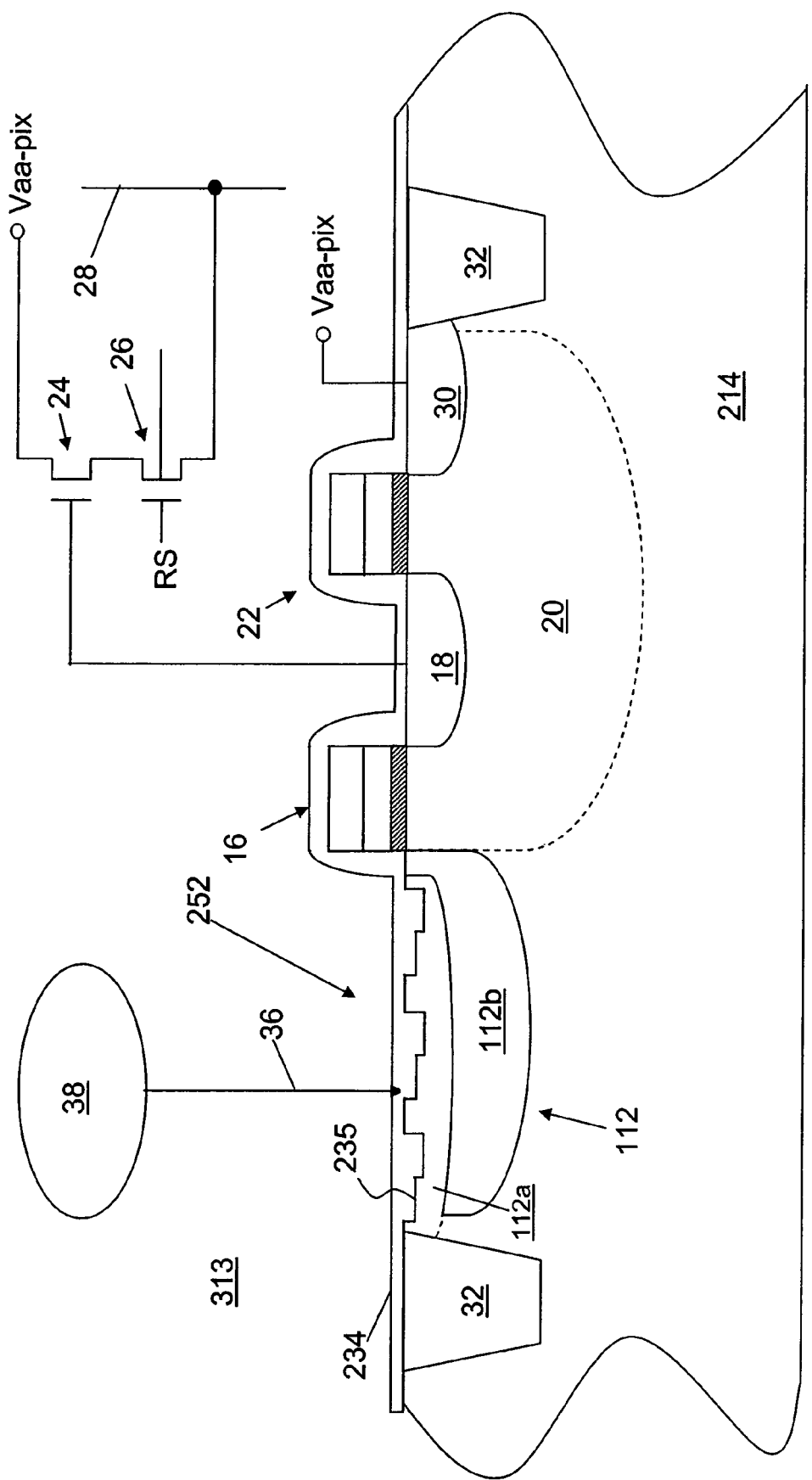
FIGS. 10 and 11 illustrate a partial cross-sectional view of a pixel cell constructed in accordance with a third exemplary embodiment of the invention.
Figure 11:
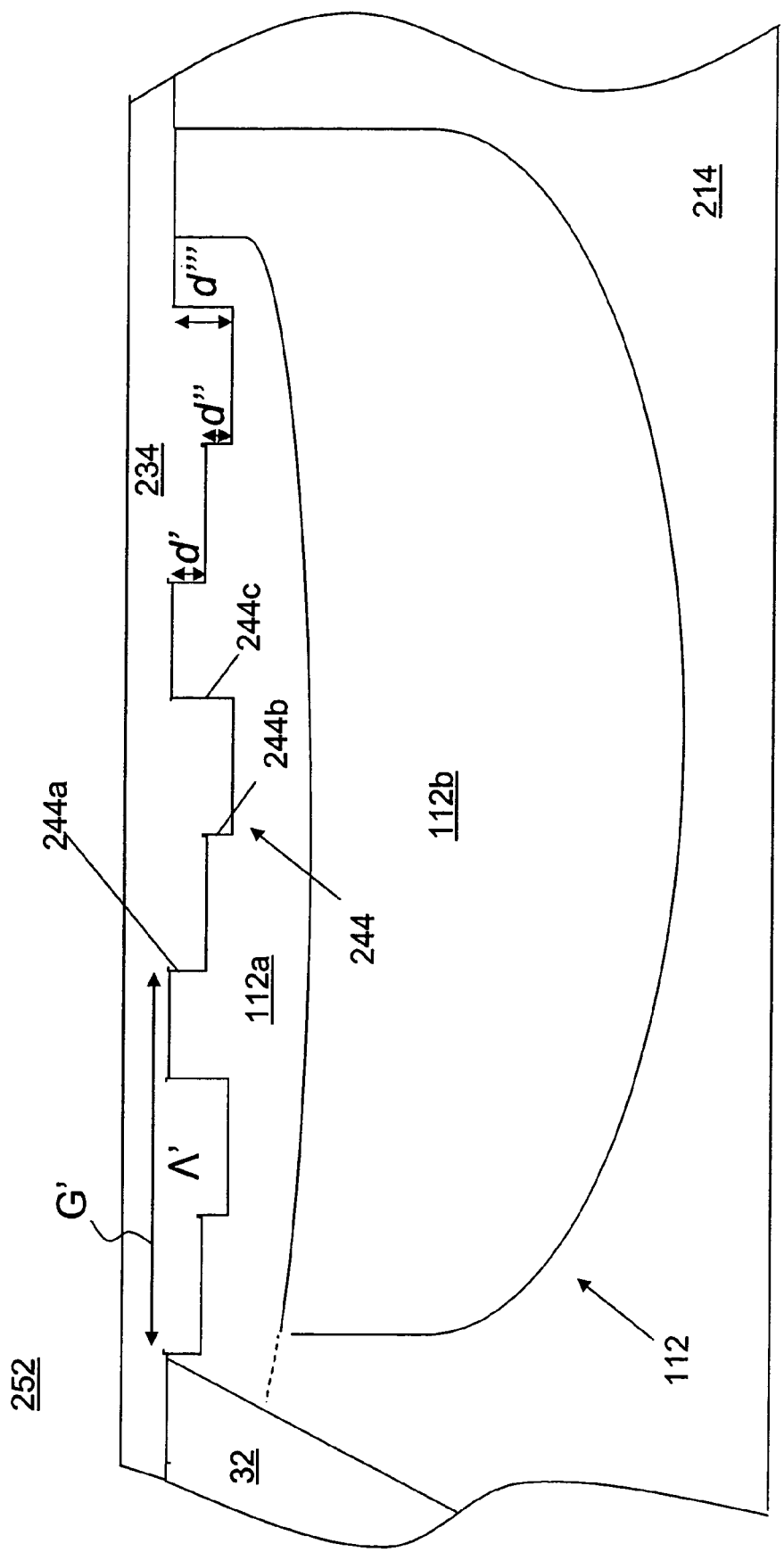

FIGS. 10 and 11 illustrate a partial cross-section of a pixel cell 313 constructed in accordance with a third exemplary embodiment of the invention. The FIG. 10 pixel cell 313 is similar to the FIG. 3 pixel cell 113 with the exception that the trenches forming the basis for the grated interface 235 between a silicon substrate 214 and an oxide layer 234 have a blazed (or step-wise) shape, rather than the semi-rectangular shape of the grated interface 135 of the FIG. 3 pixel cell 113. The blazed grating over a photosensitive region 252 of the pixel cell 313 provides for a further decrease in the disparity of indexes of refraction between the oxide layer 234 and the silicon substrate 214. The illustrated blazed interface 235 between the oxide layer 234 and the silicon substrate 214 achieves up to a 30% decrease in the incident light reflected, or a 30% increase in incident light 36 captured by the photosensor 112.

FIG. 11 illustrates a magnified portion of the photosensitive region 252 of the FIG. 10 pixel cell 313. The silicon substrate 214 has a plurality of trenches 244. The trenches 244 could be formed by any of the methods described above with respect to FIG. 4 (e.g., etching or epitaxial growth). Each of the illustrated trenches 244 has at least three sidewall regions 244a, 244b, 244c. The illustrated trench 244 has a first sidewall region 244a having a predetermined depth represented by d'. The trench 244 also has a second sidewall region 244b having a predetermined depth represented by d". The predetermined depth d" of the second sidewall region 244b could have a value less than, equal to, or greater than the depth d' of the first sidewall region 244a. The third sidewall region 244c typically has a predetermined depth represented by d'". The depth d'" of the third sidewall region 244c typically has a value equal to the depths of the first and second sidewall regions 244a, 244b combined (i.e., d'+d"=d'"). The predetermined depths d', d", d'" may have a value in the range from about 10 nm to about 250 nm.

The grating (or the distance from the beginning of one trench to the beginning of the next trench (shown as arrow G')) has a predetermined period that is represented by Λ'. The predetermined period Λ' of the grating G' may be in the range from about 100 nm to about 1000 nm.

It should be noted that the foregoing ranges are only exemplary embodiments of the present invention, and are not limiting in any way. For example, the gratings G' could have periods Λ longer than 1000 nm or shorter than 100 nm. Similarly, the depths d', d", d'" of the trenches 244 could be deeper than 250 nm or shallower than 10 nm. The actual periods Λ' and depths d', d", d'" can be manipulated depending on the intended application.

Figure 12:
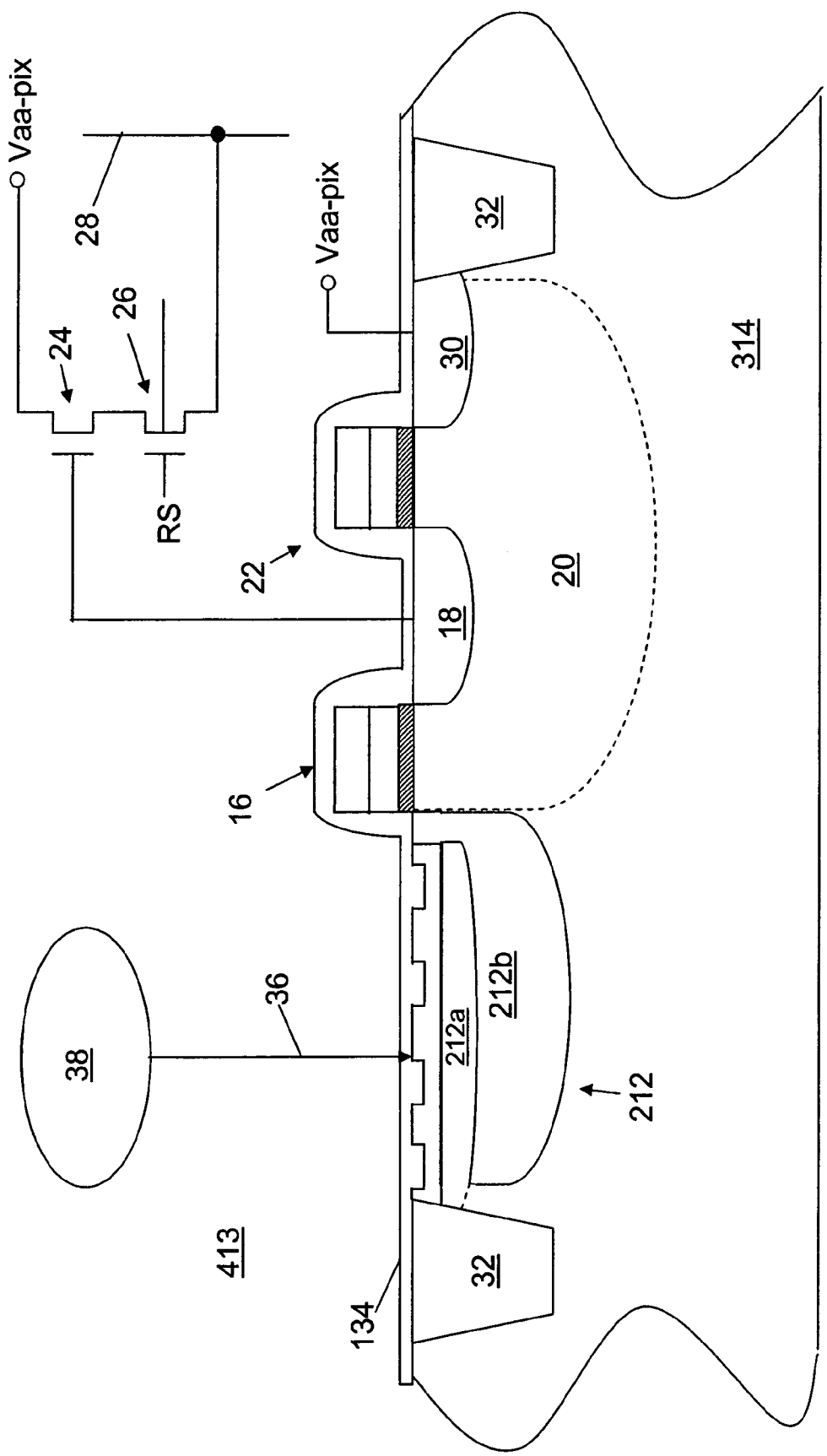
FIG. 12 illustrates a partial cross-sectional view of a pixel cell constructed in accordance with a fourth exemplary embodiment of the invention.

FIG. 12 illustrates a pixel cell 413 constructed in accordance with a fourth exemplary embodiment of the invention. The pixel cell 413 has a pinned photodiode 212 having a first doped region 212a and a second doped region 212b, formed below the surface of a substrate 314. The illustrated pixel cell 413 is otherwise similar to the FIG. 3 pixel cell 113 (including the grated interface 135).

Figure 1:
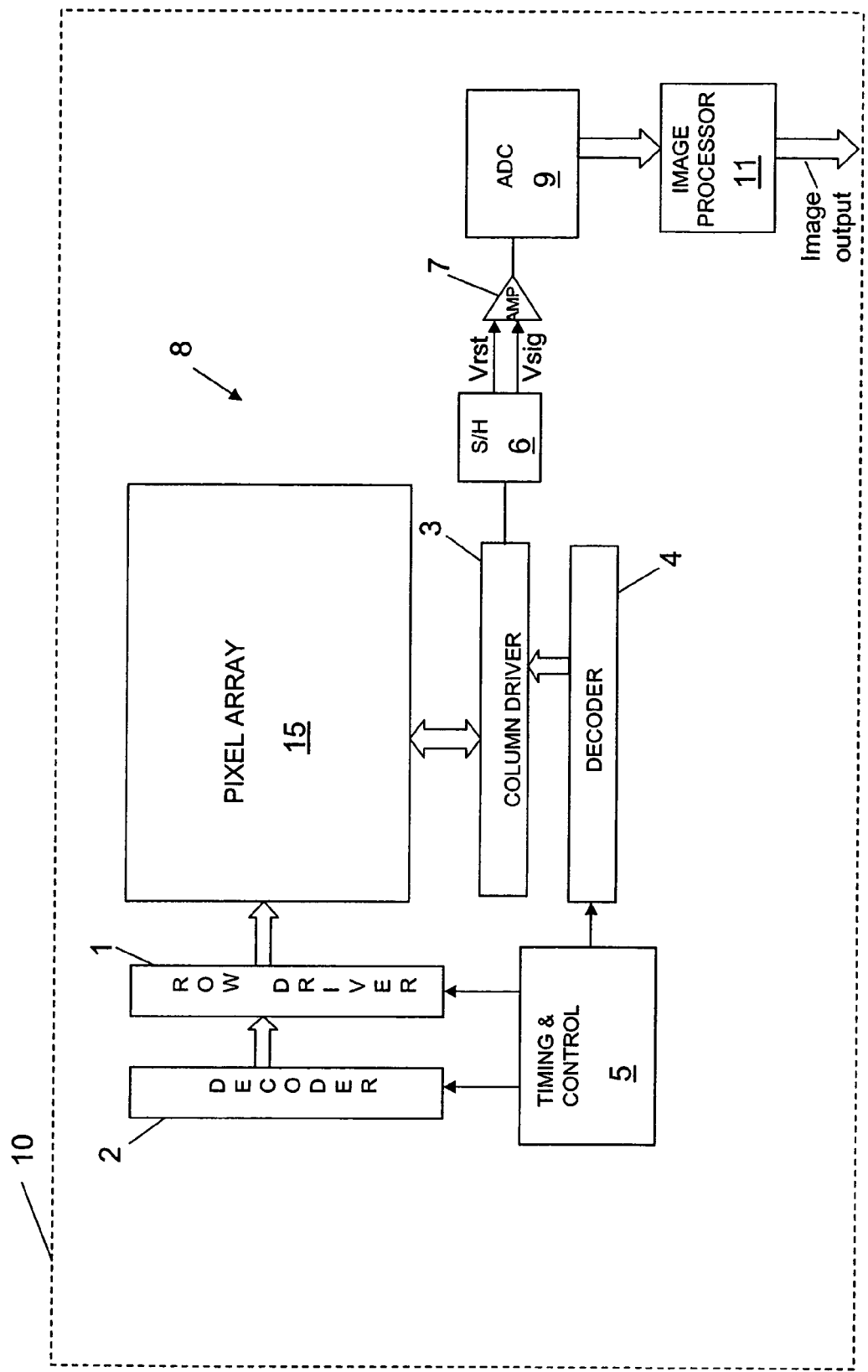
FIG. 1 illustrates a block diagram of a CMOS imager die.
Figure 13:
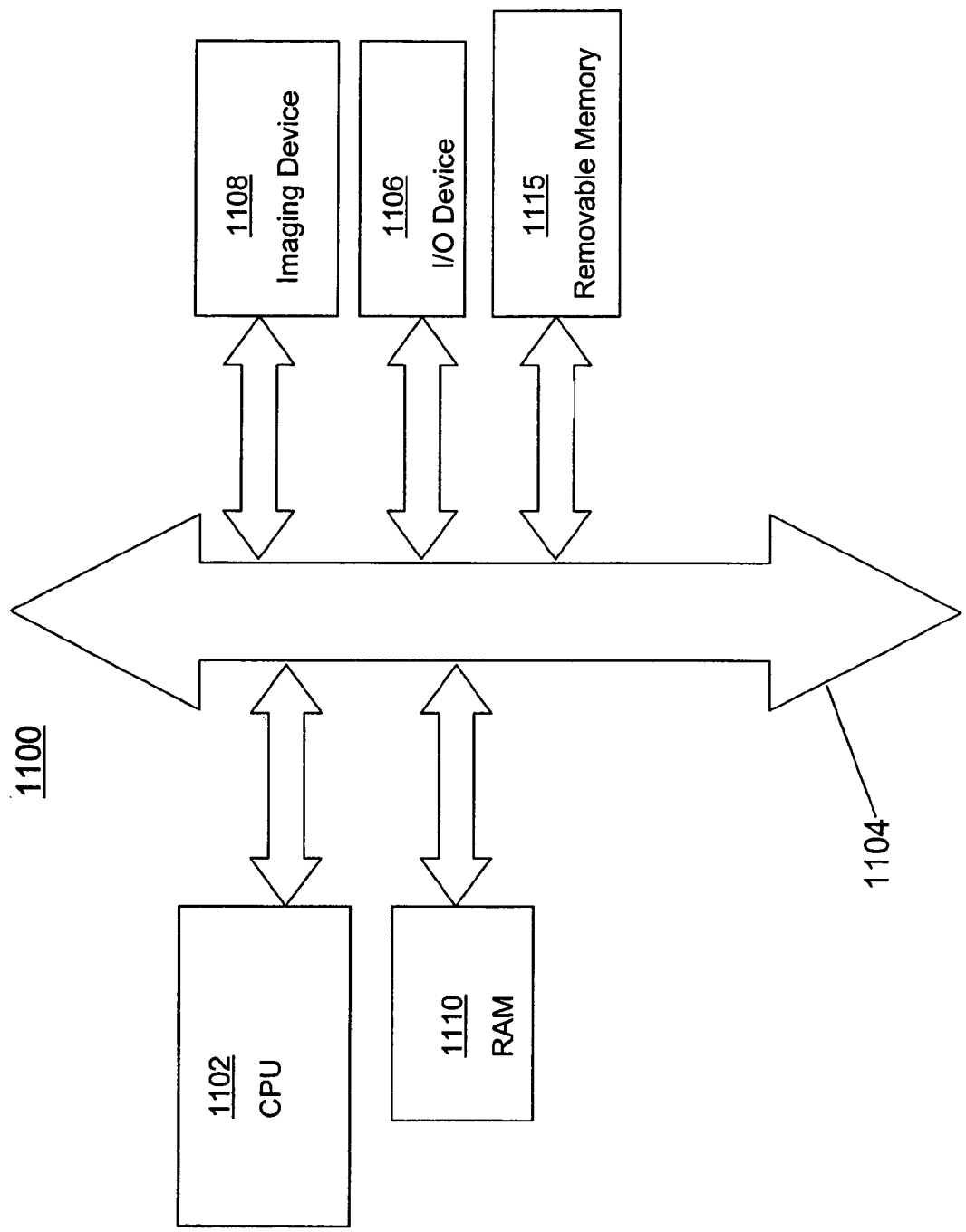
FIG. 13 is a schematic diagram of a processor system constructed in accordance with an exemplary embodiment of the invention.

The pixel cells 113, 213, 313, 413 of the invention may be combined with peripheral circuitry on an imager die similar to that illustrated in FIG. 1. For example, the pixel array 15 of the FIG. 1 imager die could include one or more of the pixel cells 113, 213, 313, 413 constructed in accordance with exemplary embodiments of the invention. The imager die having a pixel array with one or more pixel cells 113, 213, 313, 413 of the invention could be included in an imaging device. The imaging device could further be incorporated into a processor system 1100 illustrated in FIG. 13. Examples of processor based systems include, without limitation, computer systems, camera systems, scanners, machine vision systems, vehicle navigation systems, video telephones, surveillance systems, auto focus systems, star tracker systems, motion detection systems, image stabilization systems, and data compression systems for high-definition television, any of which could utilize the invention.

The system 1100 includes an imaging device 1108 including an imager die having the overall configuration depicted in FIG. 1 with at least one pixel cell of the pixel array 15 (FIG. 1) constructed in accordance with any of the various embodiments of the invention (e.g., pixel cells 113, 213, 313, 413). The system 1100 generally comprises a central processing unit (CPU) 1102, such as a microprocessor, that communicates with an input/output (I/O) device 1106 over a bus 1104. Imaging device 1108 also communicates with the CPU 1102 over the bus 1104. The system 1100 also includes random access memory (RAM) 1110, and can include removable memory 1115, such as flash memory, which also communicates with CPU 1102 over the bus 1104. Imaging device 1108 may be combined with a processor, such as a CPU, digital signal processor, or microprocessor, with or without memory storage on a single integrated circuit or on a different chip than the processor.

It should be noted that although the invention has been described with specific references to CMOS pixel cells having a grated interface between the silicon substrate and the oxide layer, the invention has broader applicability and may be used in any imaging apparatus. For example, the present invention may be used in conjunction with charge-coupled-device (CCD) imagers. The above description and drawings illustrate preferred embodiments which achieve the objects, features, and advantages of the present invention. Although certain advantages and preferred embodiments have been described above, those skilled in the art will recognize that substitutions, additions, deletions, modifications and/or other changes may be made without departing from the spirit or scope of the invention. Accordingly, the invention is not limited by the foregoing description but is only limited by the scope of the appended claims.

What is claimed as new and desired to be protected by Letters Patent of the United States:

1. A method of forming a pixel cell, the method comprising the acts of:
    forming a plurality of trenches within a silicon substrate dedicated for a first doped region of a photosensor, wherein the first doped region is over an area within the silicon substrate dedicated for a second doped region of the photosensor; and
    providing an oxide layer within and over the plurality of trenches to form a grated interface between the oxide layer and the plurality of trenches formed within the silicon substrate dedicated for the first doped region of the photosensor, wherein the oxide layer completely fills the plurality of trenches such that the topmost surface of the oxide layer is substantially planar.

2. The method of claim 1, further comprising the act of forming a photosensor comprising the first doped region and the second doped region within the silicon substrate.

3. The method of claim 2, wherein the act of forming a photosensor comprises the act of doping the silicon substrate dedicated for the first doped region with either a p-type or n-type dopant and doping the silicon substrate dedicated for the second doped region with the dopant type not used to dope the silicon substrate for the first doped region.

4. The method of claim 3, wherein the act of doping results in a pinned photodiode.

5. The method of claim 1, wherein the plurality of trenches is formed by a method selected from the group consisting of etching the silicon substrate, reactive etching the silicon substrate, and chemical etching the silicon substrate.

6. The method of claim 1, wherein the plurality of trenches within the silicon substrate dedicated for the first doped region of the photosensor is formed by providing a photoresist pattern over the silicon substrate, and forming a plurality of silicon columns by epitaxial growth.

7. The method of claim 1, wherein the plurality of trenches within the silicon substrate dedicated for the first doped region of the photosensor is formed having a substantially semi-rectangular shape.

8. The method of claim 1, wherein at least one of the plurality of trenches within the silicon substrate dedicated for the first doped region of the photosensor is formed to have a predetermined depth within a range from about 10 nm to about 250 nm, and the grated interface has a predetermined period within a range from about 100 nm to about 1000 nm.

9. The method of claim 1, wherein at least one of the plurality of trenches within the silicon substrate dedicated for the first doped region of the photosensor is formed to have at least three distinct sidewall regions having at least three distinct depths to define a grated interface between the oxide layer and the substrate.

10. The method of claim 1 further comprising forming a layer over the oxide layer, the layer selected from the group consisting of a metallization layer and an insulating layer.

11. A method of forming a pixel cell, the method comprising:
    forming a photosensor comprising a first doped region and a second doped region on a silicon substrate;
    forming a storage node provided on the silicon substrate;
    forming a transfer transistor having a gate structure provided on the silicon substrate operable for electrically interconnecting the photosensor and storage node;
    forming a plurality of trenches within only the first doped region of the silicon substrate over an area dedicated for light to pass to the photosensor;
    providing an oxide layer within and over the plurality of trenches to form a grated interface between the oxide layer and the plurality of trenches, wherein the oxide layer has a first surface in contact with the trenches and a second surface opposite the first surface, the oxide layer filling the plurality of trenches such that the entire second surface of the oxide layer is substantially planar; and
    forming a material layer over the oxide layer.

12. The method of claim 11 wherein the material layer is formed from tetraethyl orthosilicate.

13. The method of claim 12 further comprising depositing a boro-phospho-silicate glass layer over the material layer.

14. A method of forming a pixel cell, the method comprising:
forming a photosensor comprising a first doped region and a second doped region provided on a silicon substrate;
forming a storage node provided on the silicon substrate;
forming a transfer transistor having a gate structure provided on the silicon substrate operable for electrically interconnecting the photosensor and storage node;
forming a first plurality of trenches within the first doped region of the silicon substrate over an area dedicated for light to pass to the photosensor;
providing an oxide layer within the first plurality of trenches to form a first grated interface;
forming a second plurality of trenches within the topmost surface of the oxide layer; and
providing a material layer within and over the second plurality of trenches to form a second grated interface, wherein the material layer totally fills the second plurality of trenches and the topmost surface of the material layer is substantially planar.

15. The method of claim 14, wherein at least one of the first plurality of trenches within the first doped region of the silicon substrate, and the second plurality of trenches within the topmost surface of the oxide layer, is formed to have a predetermined depth within a range from about 10 nm to about 250 nm.

16. The method of claim 14, wherein at least two of the first plurality of trenches within the first doped region of the silicon substrate, and the second plurality of trenches within the topmost surface of the oxide layer, has a predetermined period within a range from about 100 nm to about 1000 nm.

17. The method of claim 14 wherein at least one of the first plurality of trenches within the first doped region of the silicon substrate is formed to have at least three distinct sidewall regions having at least three distinct depths to define a grated interface within the first grated interface.

18. A method of forming an integrated circuit comprising:
forming an array of pixel cells for capturing an image, the method of forming at least one pixel cell of the array comprising:
forming a silicon substrate having a photosensor comprising a first doped region over a second doped region, and forming a plurality of trenches exclusively within the first doped region of the photosensor located over the second doped region of the photosensor, wherein a distance measured from the beginning of at least one trench to the beginning of an adjacent trench is about 340 nm, and the at least one trench has a depth of about 100 nm; and
foaming an oxide layer provided within and over the plurality of trenches within the first doped region, wherein the oxide layer entirely fills the trenches such that the topmost surface of the oxide layer is substantially planar.

19. The method of claim 18, wherein at least one trench has at least three distinct sidewall regions having at least three distinct depths to define a grated interface.

20. The method of claim 18, wherein at least one trench has a substantially semi-rectangular shape.

21. A method for forming an integrated circuit, comprising:
forming an array of pixel cells, at least one pixel cell of the array formed by a method comprising:
forming a charge generating region comprising a first doped region and a second doped region by a method comprising:
forming a first plurality of trenches at an upper portion of the charge generating region comprising the first doped region,
forming a first material layer within and over the topmost surface of the first plurality of trenches wherein the material layer completely fills the trenches such that the topmost surface of the material layer is substantially planar and creates a hybrid interface capable of preventing reflection of incident light striking the interface, and
forming a second material layer within and over the first material layer;
forming a first charge collection region;
forming a second charge collection region for receiving charge from the first charge collection region; and
forming a gate for electrically coupling the first and second charge collection regions, the gate being formed over the semiconductor substrate.

22. The method for forming an integrated circuit of claim 21, wherein the first plurality of trenches has a period of about 340 nm and a depth of about 100 nm.

23. The method for forming an integrated circuit of claim 21, wherein the first plurality of trenches has a predetermined period and a predetermined depth for each wavelength of incident light.

24. A method of forming a pixel array comprising:
forming a plurality of photodiodes for receiving incident light from a scene and for storing charges associated with the incident light, the plurality of photodiodes providing stored charges representing an image of the scene, the method of forming each photodiode comprising;
forming a first conductivity type region provided at an upper surface of a semiconductor substrate, and
forming a second conductivity type region within the semiconductor substrate below the first conductivity type region, the second conductivity type region for storing the charges;
forming a plurality of grated interfaces respectively associated with the photodiodes through which the incident light passes, the method for forming each of the grated interfaces comprising;
forming a plurality of trenches in the first conductivity type region of a respective photodiode; and
providing a material having an index of refraction different than that of the semiconductor substrate over an upper surface of the first conductivity type region, the material having a first surface in contact with the trenches and a second surface opposite the first surface, the material filling the trenches such that the entire second surface is substantially planar, the material and semiconductor substrate providing an index of refraction for each grating that is lower than the index of refraction of the semiconductor substrate and higher than the index of refraction of the material.

25. The method of claim 24 wherein the first conductivity type region is p-type and the second conductivity type region is n-type and the semiconductor substrate is p-type.

26. The method of claim 24 wherein the first conductivity type region is n-type and the second conductivity type region is p-type and the semiconductor substrate is n-type.

27. The method of claim 24 wherein the plurality of trenches in the first conductivity region of a respective photodiode are formed by etching.

28. The method of claim 24 wherein the plurality of trenches in the first conductivity region of a respective photodiode are formed by forming a plurality of columns by epitaxial growth.

29. The method of claim 24 wherein the plurality of trenches in the first conductivity region of a respective photodiode are formed having a substantially semi-rectangular shape.

30. The method of claim 24 wherein at least one of the plurality of trenches in the first conductivity region of a respective photodiode is formed to have a predetermined depth within a range from about 10 nm to about 250 nm, and the grated interface has a predetermined period within a range from about 100 nm to about 1000 nm.

31. The method of claim 24 wherein the plurality of trenches in the first conductivity region of a respective photodiode are formed to have a plurality of different depths.

32. The method of claim 24 further comprising forming a layer over the material layer, the layer selected from the group consisting of a metallization layer and an insulating layer.

33. The method of claim 24 further comprising forming an insulating layer over the material layer, the insulating layer comprising tetraethyl orthosilicate.

34. The method of claim 33 further comprising depositing a boro-phospho-silicate glass layer over the insulating layer.

* * * * *

UNITED STATES PATENT AND TRADEMARK OFFICE
CERTIFICATE OF CORRECTION

PATENT NO. : 8,101,454 B2
APPLICATION NO. : 11/293245
DATED : January 24, 2012
INVENTOR(S) : William J. Baggenstoss It is certified that error appears in the above-identified patent and that said Letters Patent is hereby corrected as shown below:

On the cover page, item (56), under "Other Publications", in column 2, line 2, delete "Retreived" and insert -- Retrieved --, therefor.

In column 9, line 55, in Claim 18, delete "foaming" and insert -- forming --, therefor.

Signed and Sealed this
Tenth Day of April, 2012

David J. Kappos
*Director of the United States Patent and Trademark Office*